United States Patent
Liu et al.

(10) Patent No.: US 11,036,141 B2
(45) Date of Patent: Jun. 15, 2021

(54) PHOTORESIST AND MANUFACTURING METHOD OF PHOTORESIST PATTERNS

(71) Applicant: BOE TECHNOLOGY GROUP CO., LTD., Beijing (CN)

(72) Inventors: Ming Liu, Beijing (CN); Yueping Zuo, Beijing (CN); Qiuhua Meng, Beijing (CN); Chunyang Wang, Beijing (CN); Fei Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 48 days.

(21) Appl. No.: 16/424,734

(22) Filed: May 29, 2019

(65) Prior Publication Data
US 2020/0150536 A1 May 14, 2020

(30) Foreign Application Priority Data

Nov. 14, 2018 (CN) .......................... 201811351459.0

(51) Int. Cl.
G03F 7/004 (2006.01)
G03F 7/20 (2006.01)

(52) U.S. Cl.
CPC ............ G03F 7/203 (2013.01); G03F 7/0042 (2013.01)

(58) Field of Classification Search
CPC ............................... G03F 7/0042; G03F 7/203
See application file for complete search history.

(56) References Cited

U.S. PATENT DOCUMENTS

| 7,776,507 B2 | 8/2010 | Kusano et al. |
| 10,328,739 B2 | 6/2019 | Loginov et al. |
| 10,591,821 B2 | 3/2020 | Loccufier et al. |
| 2001/0031374 A1* | 10/2001 | Whang .................. H01F 41/18 428/607 |
| 2003/0022099 A1 | 1/2003 | Lin et al. |
| 2008/0030692 A1 | 2/2008 | Wang et al. |
| 2019/0259517 A1* | 8/2019 | Vaseem .................. H01F 41/02 |

FOREIGN PATENT DOCUMENTS

| CN | 1989454 A | 6/2007 |
| CN | 101192002 A | 6/2008 |
| CN | 107710075 A | 2/2018 |
| CN | 107850838 A | 3/2018 |
| JP | S55-60941 A | 5/1980 |
| TW | 499706 B | 8/2002 |

OTHER PUBLICATIONS

Chinese Office Action in Chinese Application No. 201811351459.0, dated Feb. 5, 2021 with English translation.

* cited by examiner

Primary Examiner — Daborah Chacko-Davis
(74) Attorney, Agent, or Firm — Collard & Roe, P.C.

(57) ABSTRACT

A photoresist and a method of manufacturing photoresist patterns are disclosed. The photoresist includes a plurality of photosensitive units, and each photosensitive unit has magnetism.

4 Claims, 3 Drawing Sheets

PHOTORESIST AND MANUFACTURING METHOD OF PHOTORESIST PATTERNS

CROSS REFERENCE TO RELATED APPLICATIONS

The present application claims the priority of Chinese patent application No. 201811351459.0, entitled "Photoresist and A Manufacturing Method of Photoresist Patterns" and filed on Nov. 14, 2018 to CNIPA, the entire text of which is incorporated herein by reference.

TECHNICAL FIELD

Embodiments of the disclosure relate to a photoresist and a method of manufacturing photoresist patterns.

BACKGROUND

Photo Resist (PR), also known as photoresist, is a kind of photosensitive material. Its characteristics will change when exposed to light. Photoresist is mainly used to transfer the pattern on the photolithographic mask to the wafer. Photoresists are divided into positive and negative types. After exposure, the exposed part of the positive photoresist becomes easy to dissolve and dissolves after development, leaving only the non-exposed part to form a pattern. On the other hand, negative photoresist is just the opposite. After exposure, the exposed part will become insoluble. After development, the exposed part will be left to form a pattern.

SUMMARY

Embodiments of the present disclosure relate to a photoresist and a method of manufacturing photoresist patterns.

According to at least one embodiment of the present disclosure, a photoresist is provided, comprising: a plurality of photosensitive units, each of which has magnetism.

For example, the photosensitive units comprise a photosensitive material and magnetic ions.

For example, the photosensitive material wraps the magnetic material.

For example, the magnetic material comprises magnetic nanoparticles.

For example, the magnetic nanoparticles comprise nanospheres or quantum dot microspheres.

For example, the magnetic ions comprise iron ions or nickel ions.

According to at least one embodiment of the present disclosure, a method of manufacturing a photoresist pattern is provided, comprising: applying the photoresist on the substrate; applying a magnetic field to the photoresist so that a content of the photosensitive unit at a bottom of the photoresist is greater than a content of the photosensitive unit at a top of the photoresist; and exposing and developing the photoresist to form the photoresist pattern.

For example, the applying of the magnetic field to the photoresist comprises: a magnetic member is arranged below or above the substrate on which the photoresist is formed, and the distribution of photosensitive units in the photoresist is controlled by the magnetic member.

For example, the magnetic member is a magnet.

For example, after applying the photoresist on the substrate, performing a photoresist prebake treatment on the photoresist; the applying of the magnetic field to the photoresist comprises: before performing the photoresist prebake treatment on the photoresist, applying the magnetic field to the photoresist, or applying the magnetic field to the photoresist in the process of performing the photoresist prebake treatment on the photoresist.

BRIEF DESCRIPTION OF THE DRAWINGS

The embodiments of the present disclosure will be described in more detail below with reference to the accompanying drawings in order to enable those of ordinary skill in the art to more clearly understand the embodiments of the present disclosure, in which.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative work, which shall be within the scope of the disclosure.

The inventors noticed that when the photoresist is exposed, since the illumination equipment is generally located above the top of the photoresist, and the illumination is irradiated downward from the top of the photoresist, the photosensitizer at the top of the photoresist receives more illumination, while the photosensitizer at the bottom of the photoresist receives less illumination, in this way, the slope angle of the photoresist will be smaller after development, which will result in a large error between Mask CD (Critical Dimension) and FICD (Final Check Critical Dimension), and is not conducive to the control of the critical dimension.

Figure 1:
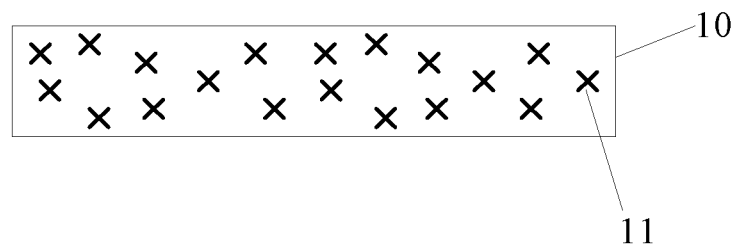
FIG. 1 is a schematically structural diagram of photoresist provided by an embodiment of the present disclosure.

An embodiment of the present disclosure provides a photoresist, as shown in FIG. 1, the photoresist 10 includes a plurality of photosensitive units 11, each of the photosensitive units has magnetism.

The photoresist 10 is a light-sensitive mixed solution including photosensitive material (such as photosensitive resin), sensitizer (such as visible spectral sensitizing dye) and solvent. In the embodiment of the disclosure, the photosensitive material in the photoresist 10 is magnetically modified to become a photosensitive unit 11 with magnetism, and then the distribution of the photosensitive unit 11 in the photoresist 10 can be changed by using an external magnetic field, that is, the distribution of the photosensitive material in the photoresist 10 is changed.

It should be noted that, for example, all of the photosensitive materials in the photoresist 10 can be magnetically modified, or some of the photosensitive materials in the photoresist 10 can be magnetically modified, and the embodiments of the present disclosure are not limited thereto. The number of photosensitive units 11 in the photoresist 10 in the embodiment of the present disclosure can be selected.

In this way, in the embodiment of the present disclosure, by providing the photosensitive units in the photoresist with magnetism, the distribution of the photosensitive units in the photoresist can be controlled through an external magnetic field, and the content of the bottom photosensitive units in the photoresist is larger than that of the top photosensitive units in the photoresist. In the exposure process, the increase of the bottom photosensitive units enables the photoresist to realize a larger exposure range under a relatively low light intensity, so that the slope angle of the developed photoresist is increased, reducing the error between a Mask CD and a FICD, and facilitating the control of crytical dimensions in the process.

For example, the method of magnetically modifying the photosensitive material in the photoresist 10 to become photosensitive units 11 with magnetism includes, for example, forming the photosensitive units 11 by chemical reaction between the photosensitive material and magnetic ions. The magnetic ions are mainly metal ion groups, such as iron ions, nickel ions, or other magnetic ions, but embodiments of the present disclosure are not limited thereto. For another example, each photosensitive unit 11 is formed by wrapping a magnetic material with a photosensitive material, the magnetic material may be magnetic nanoparticles. For example, the magnetic material may be nanospheres or quantum dot microspheres made of $Fe_3O_4$, NiFe or other magnetic compounds, but embodiments of the present disclosure are not limited thereto. The composition, size and the like of the magnetic material in the embodiment of the disclosure can be selected as required.

Another embodiment of the present disclosure provides a method of manufacturing photoresist patterns, as shown in FIG. 5 to FIG. 9, the method includes:

Step 901: apply photoresist 10 on the substrate 12.

The photoresist 10 includes a plurality of photosensitive units 11, each of the photosensitive units has magnetism.

Figure 5:
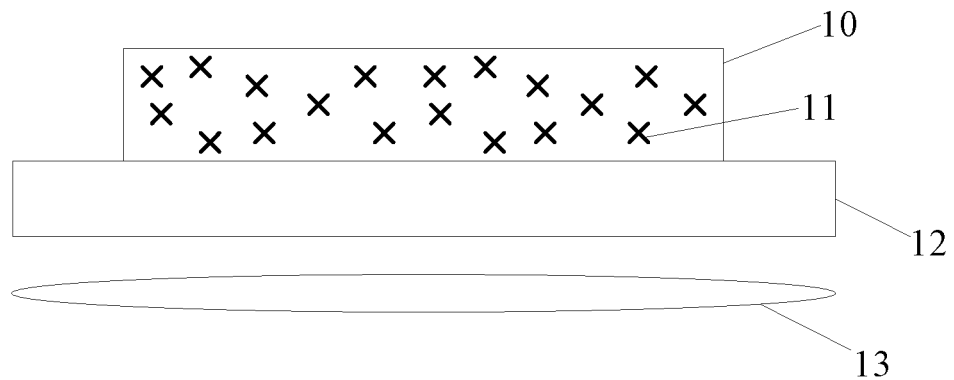
FIG. 5 is a schematically structural diagram 1 of a photoresist pattern manufacturing process provided by an embodiment of the disclosure.
Figure 6:
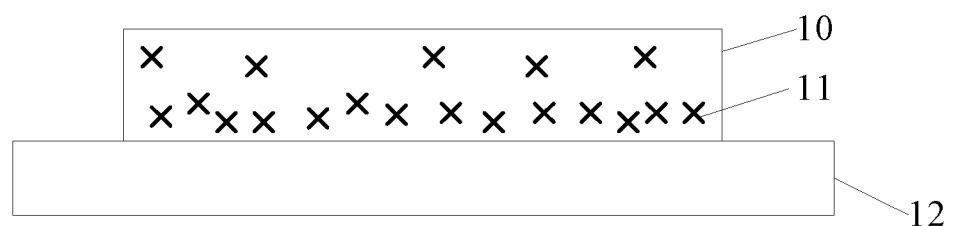
FIG. 6 is a schematically structural diagram 2 of a photoresist pattern manufacturing process provided by an embodiment of the disclosure.

Step 902: a magnetic field 13 is applied to the photoresist 10 so that the content of the photosensitive units 11 at the bottom of the photoresist 10 is larger than the content of the photosensitive units 11 at the top of the photoresist 10, as shown in FIG. 5 and FIG. 6.

For example, a magnetic member may be disposed below or above the substrate 12 on which the photoresist 10 is formed, and the distribution of the photosensitive units 11 in the photoresist 10 may be controlled by the magnetic member. The embodiments of the present disclosure do not limit the structure of the magnetic member. For example, in order to realize magnetic field control simply and conveniently, a magnet may be selected as the magnetic member.

In the embodiments of the present disclosure, the strength of the applied magnetic field 13 can be set according to situations, or as required.

Figure 7:
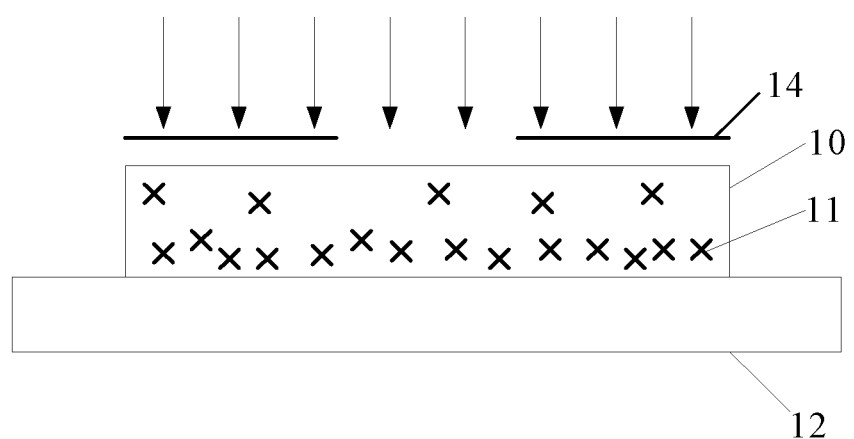
FIG. 7 is a schematically structural diagram 3 of a photoresist pattern manufacturing process according to an embodiment of the disclosure.
Figure 8:
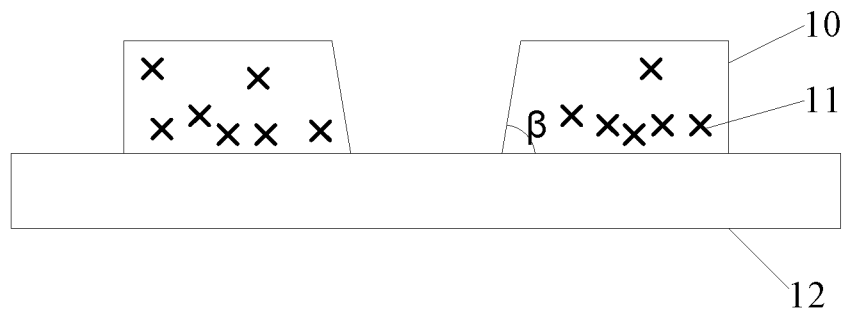
FIG. 8 is a schematically structural diagram of a photoresist pattern manufacturing process according to an embodiment of the disclosure.
Figure 9:
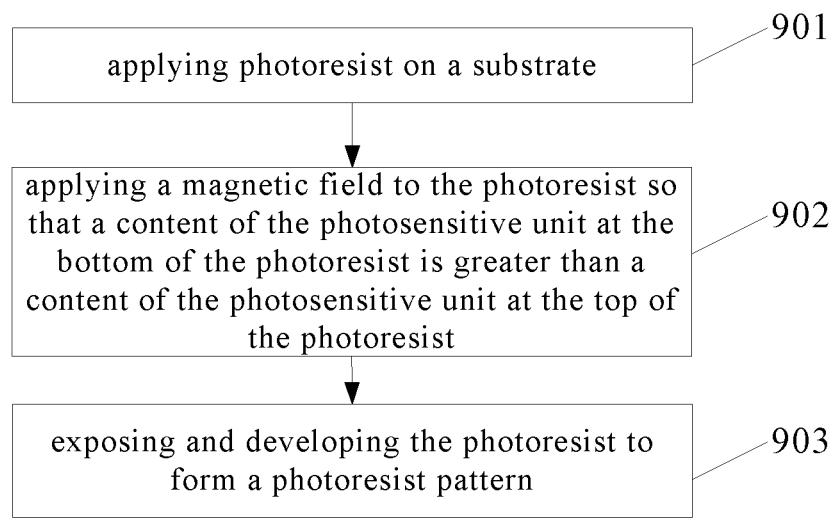
FIG. 9 is a flow chart of a photoresist pattern manufacturing process according to an embodiment of the disclosure.

Step 903: expose and develop the photoresist 10 to form a photoresist pattern, as shown in FIG. 7 and FIG. 8.

Figure 2:
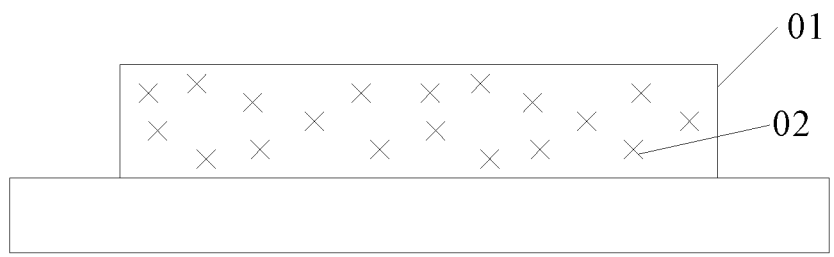
FIG. 2 is a schematically structural diagram 1 of a photoresist pattern manufacturing process.
Figure 3:
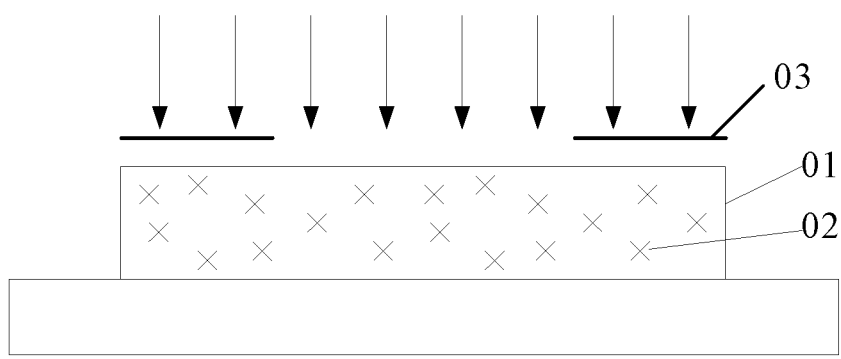
FIG. 3 is a schematically structural diagram 2 of a photoresist pattern manufacturing process.
Figure 4:
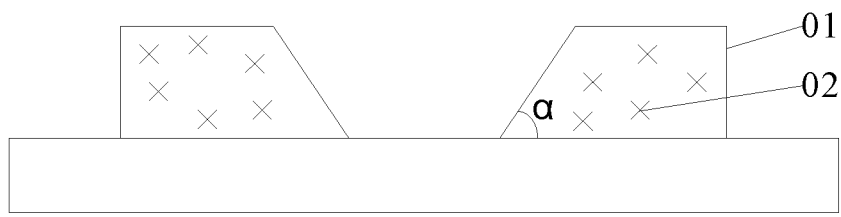
FIG. 4 is a schematically structural diagram 3 of a photoresist pattern manufacturing process.

As shown in FIG. 2 to FIG. 4, a photosensitive agent 02 (also called photosensitive material) in photoresist 01 is uniformly distributed at various positions of photoresist 01. As shown in FIG. 2 to FIG. 4, during exposure of photoresist 01, a mask plate 03 is located above the top of the photoresist 01, and illumination equipment is located above the mask plate 03, illumination is directed downward from the top of the photoresist 01, as shown in FIG. 3, which results in more illumination for photosensitizer 02 at the top of the photoresist 01 and less illumination for photosensitizer 02 at the bottom of the photoresist 01. In this way, the slope angle Alpha of the photoresist 01 will be smaller after development, as shown in FIG. 4, which will result in a larger error between Mask CD and FICD, and is not conducive to control of crytical dimensions.

In the embodiments of the present disclosure, referring to FIG. 5 to FIG. 8, the distribution of the photosensitive units 11 in the photoresist 10 is adjusted by using the applied magnetic field 13, so that the content of the bottom of the photosensitive units 11 in the photoresist 10 is larger than that of the top of the photosensitive units 11 in the photoresist 10, as shown in FIG. 5 and FIG. 6, this can make the light sensitivity of the top part weaker and the light sensitivity of the bottom part stronger. When the photoresist 10 is irradiated by light through the mask 14, the light intensity distribution on the photoresist 10 is such that the light intensity distribution of the top part is larger than that of the bottom part, and the light intensity distribution result in the existence of the slope angle of the photoresist 10. After adjustment, the top light intensity is stronger, while the top photoresist 10 is less sensitive to light. The light intensity at the bottom is weak, while the light sensitivity of the photoresist 10 at the bottom is strong, so that the slope angle Beta of the photoresist 10 can be increased, and the slope angle Beta is close to 90 degrees, as shown in FIGS. 7 and 8. This can reduce the error between a Mask CD (critical dimension) and a FICD (final inspection of critical dimension).

In some embodiments of the present disclosure, the manufacturing method may also include: after the photoresist 10 is coated on the substrate 12, performing a photoresist prebake treatment on the photoresist 10. Considering that the form of the photoresist 10 is basically fixed after the photoresist prebake treatment, and the movement of the inner photosensitive units 11 under the action of the magnetic field 13 is relatively difficult, the step of adjusting the distribution of the photosensitive units 11 in the photoresist 10 is usually performed before the photoresist 10 is subjected to the photoresist prebake treatment, or simultaneously during the photoresist prebake treatment of the photoresist 10. For example, the application of the magnetic field 13 to the photoresist 10 may be: applying the magnetic field 13 to the photoresist 10 before performing the photoresist prebake treatment on the photoresist 10, or applying the magnetic field 13 to the photoresist 10 during the photoresist prebake treatment is performed on the photoresist 10.

In the manufacturing method of the photoresist pattern provided by the embodiment of the present disclosure, the photosensitive units 11 inside the photoresist 10 coated on the substrate 12 have magnetism, the distribution of the photosensitive units 11 in the photoresist 10 can be controlled by applying a magnetic field 13, so that the content of the bottom photosensitive units 11 in the photoresist 10 is larger than that of the top photosensitive units 11. In this way, in the exposure process, the increase of the bottom photosensitive units 11 enables the photoresist 10 to realize a larger exposure range under a relatively low light intensity. In this way, the slope angle Beta of the developed photoresist 10 can be increased, the error between a Mask CD and a FICD can be reduced, and the control of crytical dimensions in the process can be facilitated.

The following points are noted:

(1) The accompanying drawings of the embodiments of the present disclosure only involve structures relevant to the embodiments of the present disclosure, and other structures may refer to a common design.

(2) Without conflicting with each other, the embodiments of the present disclosure and the characteristics in the embodiments may be combined to obtain new embodiments.

The foregoing is only the exemplary embodiments of the present disclosure, and the scope of the present disclosure is not limited thereto. A person of ordinary skill in the art can make various changes and modifications without departing from the spirit of the present disclosure, and such changes and modifications shall fall into the scope of the present disclosure.

What is claimed is:

1. A method of manufacturing a photoresist pattern, comprising:
    applying a photoresist on a substrate, wherein the photoresist comprises a plurality of photosensitive units, each of which comprises magnetism;
    applying a magnetic field to the photoresist so that a bottom portion of the photoresist that is adjacent to the substrate side, has a greater content of the photosensitive units than the top portion of the photoresist, wherein the top portion of the photoresist is opposite to the bottom portion and away from the substrate side; and
    exposing and developing the photoresist to form the photoresist pattern by an exposure light from an exposure light source.

2. The method of manufacturing the photoresist pattern according to claim 1, wherein the applying of the magnetic field to the photoresist comprises:
    a magnetic member is arranged below or above the substrate on which the photoresist is formed, and the distribution of photosensitive units in the photoresist is controlled by the magnetic member.

3. The method of manufacturing the photoresist pattern according to claim 2, wherein the magnetic member is a magnet.

4. The method of manufacturing the photoresist pattern according to claim 1, further comprising: after applying the photoresist on the substrate, performing a photoresist prebake treatment on the photoresist;
    the applying of the magnetic field to the photoresist comprises:
    before performing the photoresist prebake treatment on the photoresist, applying the magnetic field to the photoresist, or applying the magnetic field to the photoresist in the process of performing the photoresist prebake treatment on the photoresist.

* * * * *